(12) United States Patent
McRae

(10) Patent No.: US 10,862,257 B1
(45) Date of Patent: Dec. 8, 2020

(54) SYSTEM, APPARATUS, AND METHOD FOR PROVIDING AN ELECTRICAL SAFETY CIRCUIT

(71) Applicant: National Tree Company, Cranford, NJ (US)

(72) Inventor: Michael M. McRae, Ormond Beach, FL (US)

(73) Assignee: National Christmas Products LLC, Cranford, NJ (US)

( * ) Notice: Subject to any disclaimer, the term of this patent is extended or adjusted under 35 U.S.C. 154(b) by 0 days.

(21) Appl. No.: 16/444,715

(22) Filed: Jun. 18, 2019

(51) Int. Cl.
| | |
|---|---|
| *H01R 39/64* | (2006.01) |
| *H01R 24/22* | (2011.01) |
| *H01R 24/30* | (2011.01) |
| *H05K 7/02* | (2006.01) |
| *F21V 23/00* | (2015.01) |
| *F21V 23/06* | (2006.01) |
| *F21V 33/00* | (2006.01) |
| *H01R 103/00* | (2006.01) |
| *F21W 121/00* | (2006.01) |
| *F21Y 115/10* | (2016.01) |

(52) U.S. Cl.
CPC ......... *H01R 39/643* (2013.01); *F21V 23/001* (2013.01); *F21V 23/06* (2013.01); *H01R 24/22* (2013.01); *H01R 24/30* (2013.01); *H01R 39/64* (2013.01); *H05K 7/026* (2013.01); *F21V 33/0056* (2013.01); *F21W 2121/00* (2013.01); *F21Y 2115/10* (2016.08); *H01R 2103/00* (2013.01)

(58) Field of Classification Search
CPC ...... H01R 39/643; H01R 39/64; H01R 24/22; H01R 24/30; F21V 23/001; F21V 23/06; H05K 7/026
See application file for complete search history.

(56) References Cited

U.S. PATENT DOCUMENTS

| | | | | |
|---|---|---|---|---|
| 2,587,788 A | * | 3/1952 | Tacy ................... | A47G 33/126 248/522 |
| 5,979,859 A | * | 11/1999 | Vartanov ............. | A47G 33/126 248/522 |
| 2014/0334134 A1 | * | 11/2014 | Loomis ................ | A41G 1/005 362/123 |

* cited by examiner

*Primary Examiner* — Anne M Hines
(74) *Attorney, Agent, or Firm* — Ellenoff Grossman & Schole LLP; James M. Smedley; Alex Korona

(57) ABSTRACT

An apparatus is disclosed. The apparatus has a base assembly, a movable assembly that is movably supported by the base assembly and that is movable relative to the base assembly, a structural assembly that is supported by the movable assembly, a plurality of electrical assemblies supported by the structural assembly, and a first electrical connector that is electrically connectable to some of the plurality of electrical assemblies, the first electrical connector being attached to the movable assembly and including a first plurality of electrical members. The apparatus also has a second electrical connector that is electrically connectable to a power source, the second electrical connector being attached to the base assembly and including a second plurality of electrical members, and one or more contact members that are movably disposed relative to the base assembly.

20 Claims, 5 Drawing Sheets

SYSTEM, APPARATUS, AND METHOD FOR PROVIDING AN ELECTRICAL SAFETY CIRCUIT

TECHNICAL FIELD

The present disclosure generally relates to a system, apparatus, and method for providing a circuit, and more particularly to a system, apparatus, and method for providing an electrical safety circuit.

BACKGROUND

Artificial illumination includes light that is not natural light. Artificial light may be a product of human creative activity. Some artificial light may be employed for decoration, safety, or convenience. In some scenarios, decorative light displays may involve illumination of many lights.

Users of illuminated artificial lights include individuals and organizations. Some decorative artificial lights may be utilized during holidays or special occasions. Some holiday seasons during which artificial light is used may last weeks or months.

Artificial light assemblies such as artificial trees may be grounded. Some conventional techniques for grounding artificial trees include metal center poles or wire branches including internally-wired and/or externally-wired lighting and decorative items. However, conventional grounding techniques typically are not effective on some artificial trees such as, for example, a rotating tree stand.

The exemplary disclosed system, apparatus, and method are directed to overcoming one or more of the shortcomings set forth above and/or other deficiencies in existing technology.

SUMMARY OF THE DISCLOSURE

In one exemplary aspect, the present disclosure is directed to an apparatus. The apparatus includes a base assembly, a movable assembly that is movably supported by the base assembly and that is movable relative to the base assembly, a structural assembly that is supported by the movable assembly, a plurality of electrical assemblies supported by the structural assembly, and a first electrical connector that is electrically connectable to some of the plurality of electrical assemblies, the first electrical connector being attached to the movable assembly and including a first plurality of electrical members. The apparatus also includes a second electrical connector that is electrically connectable to a power source, the second electrical connector being attached to the base assembly and including a second plurality of electrical members, and one or more contact members that are movably disposed relative to the base assembly, the one or more contact members moving relative to the base assembly when the movable assembly moves relative to the base assembly. The first plurality of electrical members and the second plurality of electrical members remain electrically connected via the one or more contact members when the one or more contact members moves relative to the base assembly when the movable assembly moves relative to the base assembly.

In another aspect, the present disclosure is directed to an apparatus. The apparatus includes a base assembly including at least one first elongated recess having a first conductive surface, a rotatable assembly that is rotatably supported by the base assembly and that is rotatable relative to the base assembly, the rotatable assembly including at least one second elongated recess having a second conductive surface that faces the first conductive surface, a structural assembly that is supported by the rotatable assembly, a plurality of electrical assemblies supported by the structural assembly, and a first electrical connector that is electrically connectable to some of the plurality of electrical assemblies, the first electrical connector being attached to the rotatable assembly and including a first plurality of electrical members. The apparatus also includes a second electrical connector that is electrically connectable to a power source, the second electrical connector being attached to the base assembly and including a second plurality of electrical members, and one or more contact members that are movably disposed in a cavity formed between the first and second conductive surfaces, the one or more contact members movable along the cavity when the movable assembly moves relative to the base assembly. The first plurality of electrical members and the second plurality of electrical members remain electrically connected via the first and second conductive surfaces and the one or more contact members when the movable assembly moves relative to the base assembly.

DETAILED DESCRIPTION AND INDUSTRIAL APPLICABILITY

Figure 1:
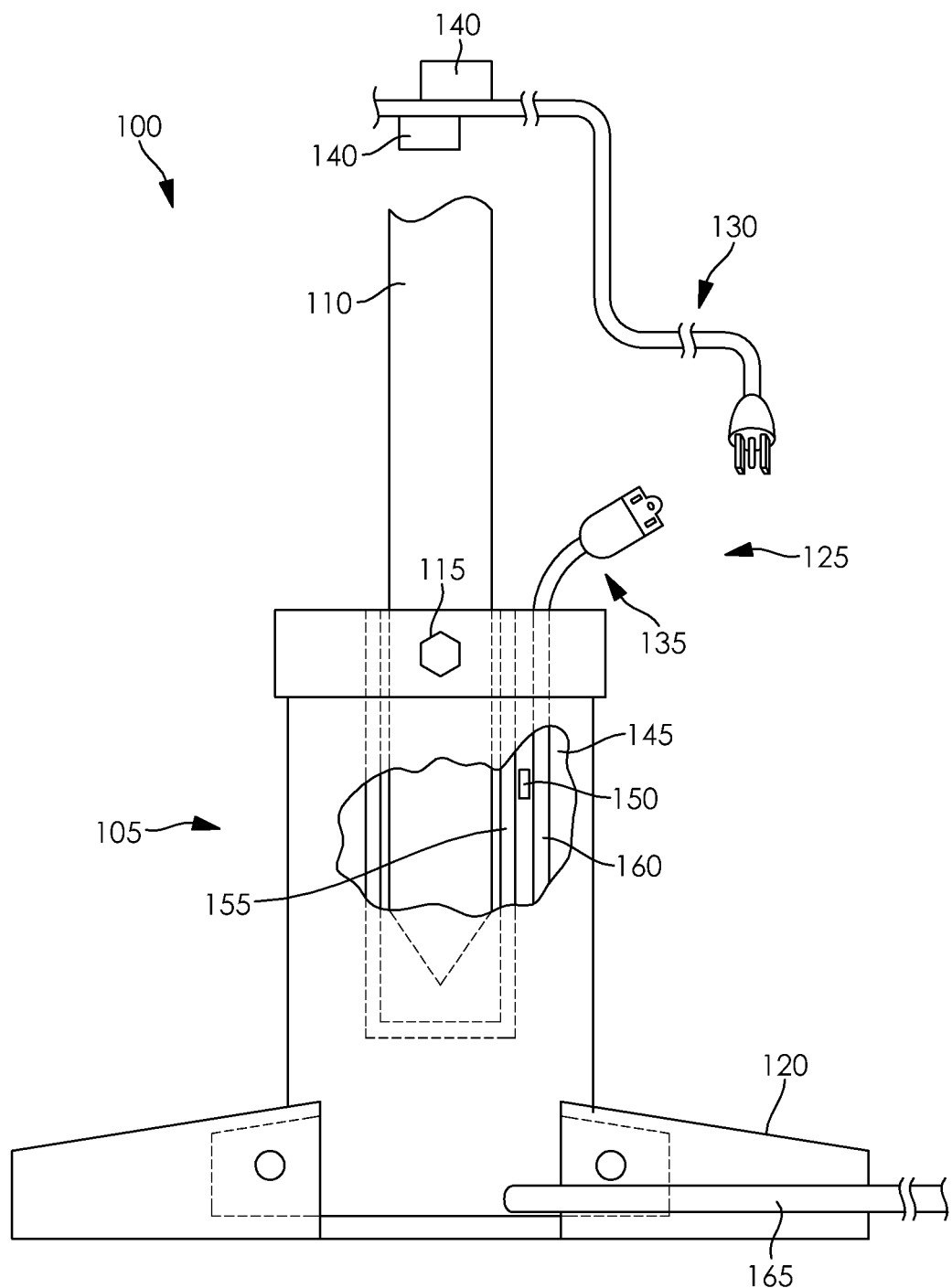
FIG. 1 illustrates a side view of at least some exemplary embodiments of the present disclosure.

The exemplary disclosed system, apparatus, and method may provide an electrical safety circuit. For example, the exemplary disclosed system, apparatus, and method may be used in any suitable application for grounding an electrical device. In at least some exemplary embodiments, the exemplary disclosed system, apparatus, and method may be used in any application involving grounding a decorative lighting assembly and/or any other suitable device that may be grounded. For example, the exemplary disclosed system, apparatus, and method may be used in any suitable application for providing an electrical safety circuit for a rotating artificial tree stand.

In at least some exemplary embodiments, the exemplary disclosed system may include a 3-wire safety rotary base for artificial trees that has a 3-wire AC (alternating current) grounding feature. For example, the exemplary disclosed system may allow for a grounded tree to be able to be used with a rotating tree stand. In at least some exemplary embodiments, the exemplary disclosed system may include a rotary stand that includes a 3-wire safety circuit.

In at least some exemplary embodiments, the exemplary disclosed system may include rotary bases or stands having a 3-wire safety AC circuit for the grounded trees. For example, the exemplary disclosed system may include a rotating artificial tree having a 3-wire safety socket that allows a 3-wire safety plug to be connected for trees that have a safety grounded pole. The exemplary disclosed system may include an AC socket for a 3-wire safety connection.

In at least some exemplary embodiments, the exemplary disclosed system may include a stand that is a round pot style tree stand. The exemplary disclosed system may also include a rotary stand that provides a grounded 3-wire socket and also a DC (direct current) socket for one or more low voltage decorative elements disposed on an artificial tree or other exemplary assembly.

In at least some exemplary embodiments, the exemplary disclosed system may include a rotary tree stand that is configured to receive (e.g., accept) a full-size artificial tree that may be disposed (e.g., placed) on and/or in the rotary base. The exemplary disclosed rotary stand base may include a safety 3-wire grounding system and electronic components that may control a rotation function of the base and tree. The exemplary disclosed system may also provide low voltage DC voltage output for decorative items such as LEDs (e.g., light-emitting diode elements). The exemplary disclosed system may further provide an external switch to control lighting patterns of the exemplary low voltage output.

In at least some exemplary embodiments, the exemplary disclosed system may include a rotary stand having a Wi-Fi/Bluetooth system including a Wi-Fi/Bluetooth receiver. The exemplary Wi-Fi/Bluetooth receiver may provide remote control of rotary functions of the rotary stand and DC lighting signals for LED display variations of the exemplary disclosed system. The exemplary Wi-Fi/Bluetooth system may also connect to an audio system (e.g., recording and replay audio system) for storage and replaying of messages and songs from any suitable device (e.g., computers, smart devices such as smart phones, tablets, systems such as Alexa, and/or Google-type devices). In at least some exemplary embodiments, the exemplary disclosed system may provide a Bluetooth function to the exemplary stand (e.g., rotary stand) to allow remote control of rotary functions of the rotary stand, remote control of the exemplary disclosed DC LED lighting displays, and/or audio replication of messages and music from user devices such as smart devices.

FIG. 1 illustrates an exemplary system 100. System 100 may be a decorative system such as an artificial tree system including a plurality of lighting elements. Exemplary system 100 may include an assembly 105 and a member 110. Assembly 105 may be a rotary stand. Assembly 105 may be for example a stand for an artificial lighting arrangement. For example, assembly 105 may be an artificial tree stand. In at least some exemplary embodiments, assembly 105 may be a rotary artificial tree stand. Member 110 may be an elongated member that may be removably attached (e.g., or permanently attached) to assembly 105. For example, member 110 may be a pole such as a metal pole of an artificial tree or any other suitable lighting arrangement member. Member 110 may be fastened to assembly 105 via a fastener 115. Fastener 115 may be any suitable fastening device for attaching member 110 to assembly 105 such as, for example, a bolt (e.g., securing bolt), a screw, and/or any other suitable mechanical fastener (e.g., or any other suitable fastener such as a magnetic fastener, a hook and loop fastener, an adhesive material, and/or any other suitable fastening device). In at least some exemplary embodiments, fastener 115 may be a securing bolt having a pointed portion (e.g., sharp point) that may make contact with a surface of member 110. Assembly 105 may include a plurality of members 120 that may be legs or any other suitable structural members for maintaining assembly 105 in a stable (e.g., stationary) position.

System 100 may include an electrical system 125. Electrical system 125 may include an electrical component 130 and an electrical component 135. Electrical component 130 may be an electrical plug. For example, electrical component 130 may be a 3-wire plug having a fuse. Electrical component may be electrically connected to one or more electrical elements 140 that may be for example lighting elements (e.g., LEDs of an artificial tree or other suitable electrically-powered elements of an assembly). For example, electrical elements 140 may be LED lighting assemblies, incandescent lighting assemblies, halogen lighting assemblies, and/or any other desired type of lighting assembly or electrical decoration. Electrical components 130 and/or 135 may ground electrical elements 140 to member 110.

Electrical component 130 may be removably attachable to electrical component 135. For example, electrical component 135 may be an electrical socket (e.g., 3-wire socket) that removably receives electrical component 130 that may be a 3-wire plug. Each of electrical components 130 and 135 may include an additional safety wire (e.g., a third wire added to a 2-wire system) that may be added to a circuit to provide a safety ground socket for grounded electrical systems such as grounded artificial trees.

Electrical component 135 may include AC (alternating current) leads 145. Electrical component 135 may also include a connection portion 150. Connection portion 150 may be a safety ground bond that may connect electrical component 135 to a portion 155 of assembly 105 (e.g., to portion 155 such as a metal trunk stand tube of assembly 105). Electrical component 135 may include a ground wire 160. In at least some exemplary embodiments, electrical component 135 may be a 3-wire safety socket that may be attached to electrical component 130 that may be a plug from a grounded artificial tree. Ground wire 160 may be an additional safety wire (e.g., a third wire added to a 2-wire system) that may be electrically connected (e.g., receive in an electrical circuit) in a manner similar to a slip ring or spring loaded contact to a ring contact strip. For example, ground wire 160 may be electrically connected in a similar manner as a 2-wire system to which ground wire 160 may be incorporated as an additional safety wire.

Electrical system 125 may also include an electrical component 165. Electrical component 165 may be a 3-wire power lead. Electrical component 130, electrical component 135, and electrical component 165 may be electrically connected to provide power to components of system 100. Electrical component 135 and electrical component 165 may be integral portions of the same component or may be removably attached or fixedly attached to each other.

Figure 2:
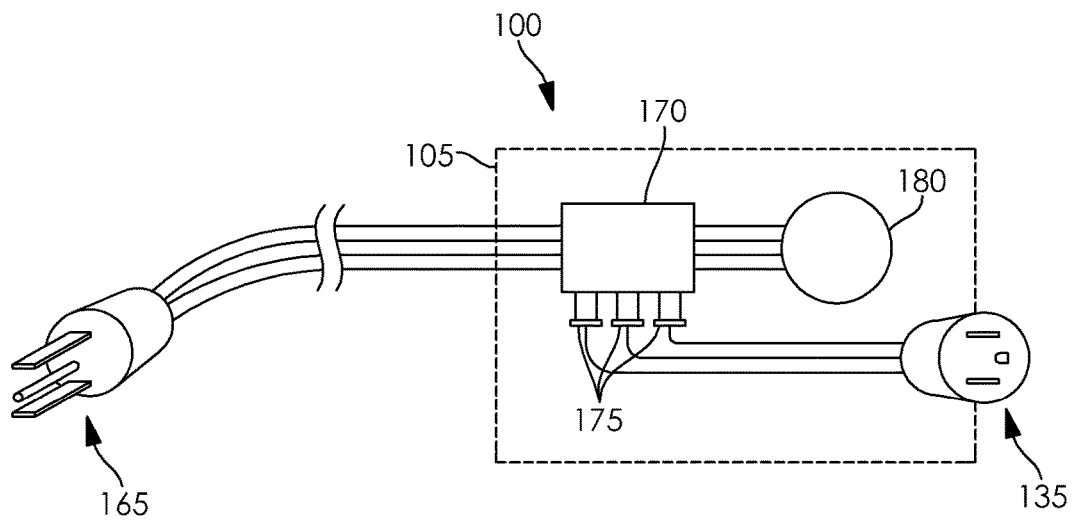
FIG. 2 illustrates a schematic view of at least some exemplary embodiments of the present disclosure.

FIG. 2 schematically illustrates a circuit diagram of an exemplary disclosed circuit of system 100 of FIG. 1, including assembly 105 (e.g., a rotary artificial tree stand as illustrated in FIG. 1). As illustrated in FIG. 2, the exemplary disclosed circuit of system 100 may be a 3-wire safety ground circuit including electrical component 165 (e.g., a 3-wire safety AC plug) and electrical component 135 (e.g., an AC outlet such as a 3-wire AC socket). Additionally for example, one or more contactors 170 that may be conductive spring-loaded contactors may be electrically connected to an actuator 180 (e.g., motor) that may be similar to the exemplary actuator described below regarding FIG. 3. Contactor 170 may include one or more contact strips 175. Contactor 170 and a plurality of ring conductors disposed in assembly 105 may make electrical contact (e.g., when assembly 105 includes a rotatable assembly that rotates as described for example below regarding FIG. 3).

Figure 3:
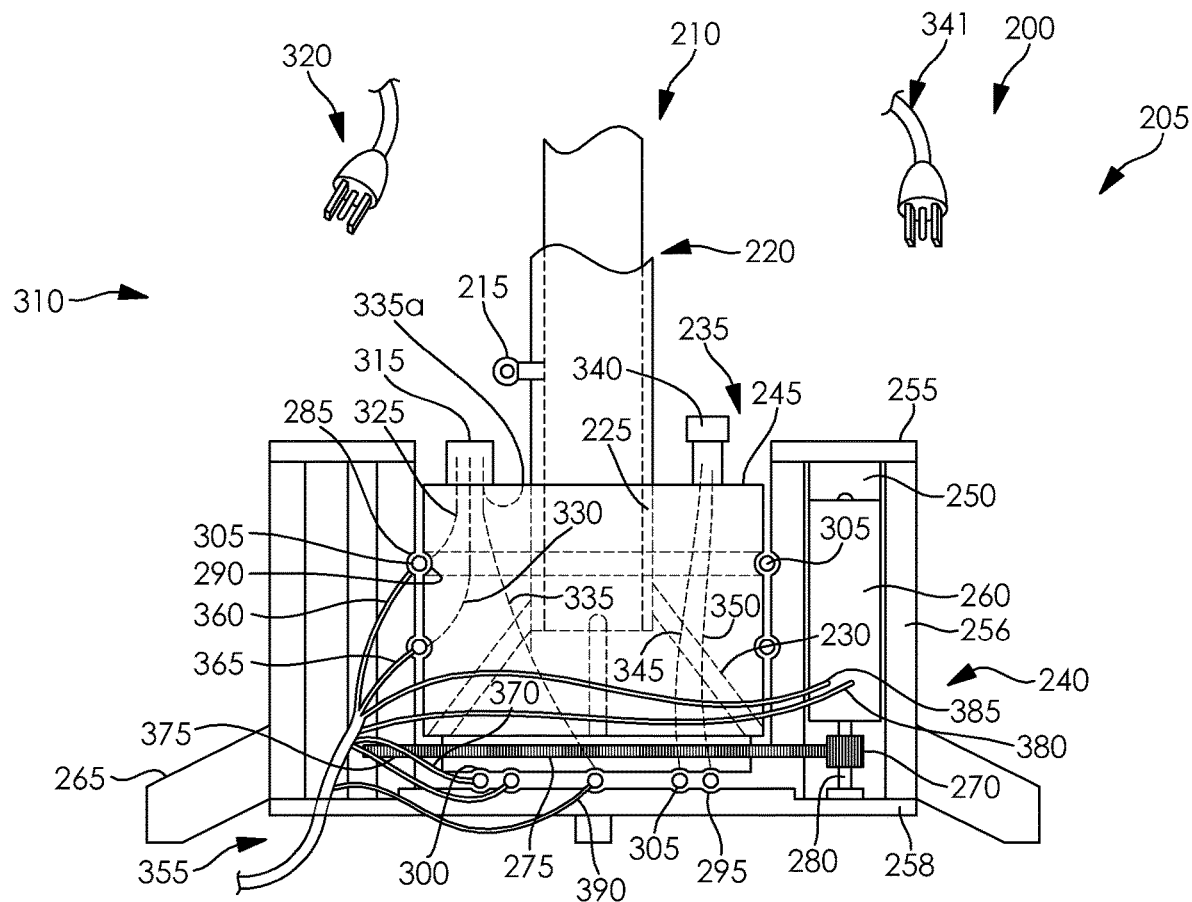
FIG. 3 illustrates a side view of at least some exemplary embodiments of the present disclosure.

FIG. 3 illustrates an exemplary system 200. Exemplary system 200 may include an assembly 205 and a member 210 that may be generally similar to member 110. Member 210 may be fastened to assembly 205 via a fastener 215 that may be generally similar to fastener 115. For example, assembly 205 may include a housing 220 that may be configured to receive member 210. Housing 220 may be a pole tube such as a tree pole tube. Housing 220 may include a plurality of members (e.g., tube member 225) configured to receive and maintain member 210 in a stationary position. Assembly 205 may also include a plurality of support members 230 (e.g., forming a tree stand structure) that may structurally support tube member 225. In at least some exemplary embodiments, assembly 205 may be an artificial tree rotary base configured as a round pot style stand for supporting small artificial trees.

Assembly 205 may include a movable assembly (e.g., movable in any direction) such as rotatable assembly 235 and a base assembly 240. Base assembly 240 may be for example a stand structure that supports rotatable assembly 235. Rotatable assembly 235 may for example include housing 220 and support members 230. For example, housing 220 and support members 230 may be supported within a rotatable housing 245 of rotatable assembly 235. Rotatable assembly 235 may be movably disposed on or in base assembly 240. For example, rotatable assembly 235 may be rotatably disposed on or in base assembly 240. Base assembly 240 may include one or more members 265 that may be similar to member 120.

Base assembly 240 may be a housing in which one or more cavities 250 are formed. One or more cavities 250 may be formed by one or more cover members 255, one or more side members 256, and one or more bottom members 258. One or more cover members 255 may be removably attached to one or more side members 256 of base assembly 240 to selectively access cavity 250. An actuator 260 may be disposed in cavity 250 or located at any other suitable portion of assembly 205. Actuator 260 may be a motor (e.g., an electrical motor or any other suitable type of electromechanical, mechanical, hydraulic, pneumatic, magnetic, and/or any other suitable device for selectively moving rotatable assembly 235). Actuator 260 may selectively move a plurality of movable members 270 and 275. For example, movable members 270 and 275 may be a plurality of gears configured to be actuated by actuator 260 to move rotatable assembly 235 on or in base assembly 240. For example, movable member 270 may be attached to a shaft 280 actuated by actuator 260. Movable member 270 may engage with movable member 275 that may be attached to rotatable assembly 235, thereby moving (e.g., rotating) rotatable assembly 235 on or in base assembly 240. In at least some exemplary embodiments, actuator 260 may be a rotational motor that is mounted (e.g., vertically mounted) on a side of base assembly 240 (e.g., a pot). Actuator 260 may move movable members 270 and 275 disposed on a bottom of assembly 205.

Base assembly 240 may include a plurality of recesses 285 disposed on surface of base assembly 240 facing a side of rotatable assembly 235. Rotatable assembly 235 may include a plurality of recesses 290 disposed on a surface of rotatable assembly facing recesses 285. Recesses 285 and 290 may face each other and be aligned with each other (e.g., remain aligned as rotatable assembly 235 rotates on or in base assembly 240). Base assembly 240 may also include a plurality of recesses 295 disposed on surface of base assembly 240 facing a bottom of rotatable assembly 235. Rotatable assembly 235 may include a plurality of recesses 300 disposed on a surface of rotatable assembly 235 facing recesses 295. Recesses 295 and 300 may face each other and be aligned with each other (e.g., remain aligned as rotatable assembly 235 rotates on or in base assembly 240). Recesses 285, 290, 295, and 300 may be elongated recesses or grooves formed in conductive material of rotatable assembly 235 and base assembly 240 that may be configured to receive a contact member such as a conductive member 305 (e.g., in cavities formed by respective recesses 285, 290, 295, and 300). For example, recesses 285, 290, 295, and 300 may be conductive bearing rings configured to receive conductive members 305 (e.g., a ball bearing or other suitable conductive member). Conductive members 305 may be configured to fit within cavities formed between recesses 285 and 290 or between recesses 295 and 300. Conductive members 305 may be conductive ball bearings that provide electrical contact between components of assembly 205 (e.g., between rotatable assembly 235 and base assembly 240). Such exemplary electrical contact may also be provided via slip rings and/or any other suitable technique for making electrical connection (e.g., conductive members 305 may be slip rings).

System 200 may include an electrical system 310 that may have components that are generally similar to components of electrical system 125. Electrical system 310 may include an electrical connector such as an electrical component 315 that may be generally similar to electrical component 135. For example, electrical component 315 may be 3-wire safety end socket that may be removably attachable to an electrical component 320 that may be similar to electrical component 130. As illustrated in FIG. 3, electrical component 315 may be electrically connected to conductive surfaces of recesses 290 via electrical members 325 and 330 (e.g., electrical wires or other suitable members for electrically connecting components). Electrical component 315 may also be electrically connected to conductive surfaces of recesses 300 via electrical member 335 that may be similar to electrical members 325 and 330. Electrical member 335 may be for example a third wire that may be similar to ground wire 160. Electrical member 335 may include an electrical member 335*a* that may be a third wire safety as illustrated in FIG. 3.

Electrical system 310 may also include an electrical component 340. Electrical component 340 may be for example a DC (direct current) connector such as a female DC connector for LEDs or any other suitable electrical component. As illustrated in FIG. 3, electrical component 340 may be electrically connected to conductive surfaces of recesses 300 via electrical members 345 and 350 that may be similar to electrical members 325 and 330. Electrical members 345 and 350 may be electrically connected via conductive members 305 to electrical members disposed in base assembly 240 and electrically connected as described below regarding FIG. 4 (e.g., electrically connected to a switch as described below). Returning to FIG. 3, electrical component 340 may form part of a DC circuit and socket for electrical components such as low voltage lighting components (e.g., decorations such as holiday decorations) and LED lighting. Electrical component 340 may be a DC socket configured to receive an electrical component 341 (e.g., having DC leads from low voltage lighting components).

Electrical system 310 may further include an electrical connector such as an electrical component 355. Electrical component 355 may provide electrical current from a power source and/or control assembly (e.g., controller such as a microcontroller or other suitable electrical or electro-mechanical control assembly). For example, electrical component 355 may provide AC and/or DC electric power from a power source and/or controller (e.g., from control). Electrical component 355 may be in electrical contact with additional electrical components of system 200 as described below regarding FIG. 4. Returning to FIG. 3, electrical component 355 may be electrically connected to conductive surfaces of recesses 285 via electrical members 360 and 365 that may be similar to electrical members 325 and 330. Electrical members 360 and 365 may be AC leads. As illustrated in FIG. 3, electrical member 360 may be electrically connected via one of recesses 285, one of conductive members 305, and one of recesses 290 to electrical member 325. Also as illustrated in FIG. 3, electrical member 365 may be electrically connected via one of recesses 285, one of conductive members 305, and one of recesses 290 to electrical member 330.

As illustrated in FIG. 3, electrical component 355 may be electrically connected to conductive surfaces of recesses 295 via electrical members 370 and 375 that may be similar to electrical members 325 and 330. Electrical members 370 and 375 may be DC leads. Also as illustrated in FIG. 3, electrical component 355 may be electrically connected to actuator 260 via electrical members 380 and 385 that may be similar to electrical members 325 and 330. Electrical members 380 and 385 may be actuator leads (e.g., motor leads) for powering actuator 260.

As illustrated in FIG. 3, electrical component 355 may be electrically connected to conductive surfaces of one of recesses 295 via an electrical member 390 that may be similar to electrical members 325 and 330. Electrical member 390 may be an AC safety component such as an AC third wire safety end. As illustrated in FIG. 3, electrical member 390 may be electrically connected via one of recesses 295, one of conductive members 305, and one of recesses 300 to electrical member 335. Electrical members 335 and 390 may be electrically connected and may operate as a third wire similar to ground wire 160. Electrical members 335 and 390 may form a safety wire of a grounded 3-wire AC circuit having a 3-wire safety socket.

Figure 4:
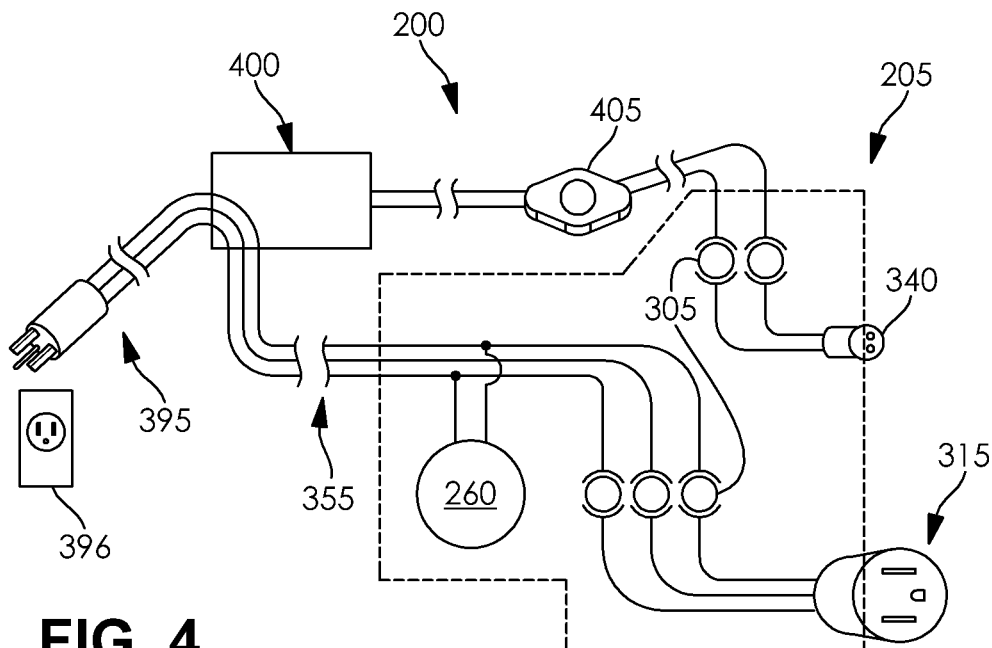
FIG. 4 illustrates a schematic view of at least some exemplary embodiments of the present disclosure.

FIG. 4 schematically illustrates a circuit diagram of an exemplary disclosed circuit of system 200 of FIG. 3, including assembly 205 (e.g., a small round pot rotary artificial tree stand as illustrated in FIG. 3). As illustrated in FIG. 4, the exemplary disclosed circuit of system 200 may be a 3-wire safety ground circuit including electrical component 355, an electrical component 395 (e.g., a 3-wire safety AC plug that may be connected to a power source such as a wall outlet or other suitable power source), electrical component 315 (e.g., an AC outlet such as a 3-wire AC socket), and electrical component 340 (e.g., a DC connector such as a 2-pin DC output). The exemplary disclosed circuit of system 200 may also include an electrical component 400 that may be a power adapter. Electrical component 400 may be electrically connected between electrical component 395 and electrical component 355. Electrical component 395 may be selectively electrically attachable to a power source 396 (e.g., a power outlet such as a wall outlet, a generator, or any other suitable power source such as an electrical power source). Electrical component 400 may be for example an AC/DC, HI/LO adapter that may be used to selectively provide low voltage power based on an operation of a controller (e.g., any suitable controller such as a microcontroller) and any suitable switch. Electrical component 400 may provide varied current and voltages of DC power that is passed through assembly 205 for low voltage DC decorations and/or any other suitable electrical assemblies. Electrical component 400 may provide any suitable current and voltage of AC and/or DC electricity to system 200. As illustrated in FIG. 4 and as described for example above, actuator 260 may be electrically connected to electrical component 355 as well as to other exemplary electrical components. Additionally for example, conductive members 305 (e.g., conductive ball bearings) may make electrical contact between components of assembly 205 and electrical system 310 when rotatable assembly 235 rotates within base assembly 240 as described for example above. The exemplary disclosed circuit of system 200 may also include an electrical component 405 that may be a controller such as a switch (e.g., foot switch or any other suitable controller having a user interface to receive input from a user). Electrical component 405 may be electrically connected to and may be used to control an operation of electrical component 400 and/or other components of electrical system 310 (e.g., control a lighting pattern, rotation, and/or any other suitable operation of assembly 205, exemplary disclosed lighting assemblies of system 200, and/or decorations of system 200).

An exemplary operation of system 200 illustrated in FIGS. 3 and 4 will now be described. A user may selectively control an operation of system 200 using electrical component 405 (e.g., a switch). Electrical component 405 may provide input to electrical component 400 (e.g., an adaptor) and components of assembly 205 (e.g., actuator 260) to control a lighting pattern, rotation, and/or any other suitable operation of system 200. For example, actuator 260 may be selectively controlled to rotate shaft 280 and movable member 270, which may engage with movable member 275 that may be attached to rotatable assembly 235. Rotatable assembly 235 may thereby be rotated on or in base assembly 240. As rotatable assembly 235 rotates, conductive members 305 (e.g., ball bearings) may be retained (e.g., movably retained) between recesses 285 and 290 and between recesses 295 and 300, thereby maintaining electrical contact between components of electrical system 310 disposed in or at rotatable assembly 235 and base assembly 240 as rotatable assembly 235 rotates (e.g., conductive members 305 may move within the cavities formed by the exemplary disclosed recesses). A 3-wire safety circuit may thereby be provided (e.g., by electrical connection between electrical component 315 and electrical component 355 (e.g., and electrical component 395) as described above, as well as between other electrical components as described above during a rotation of components of system 200.

Figure 5:
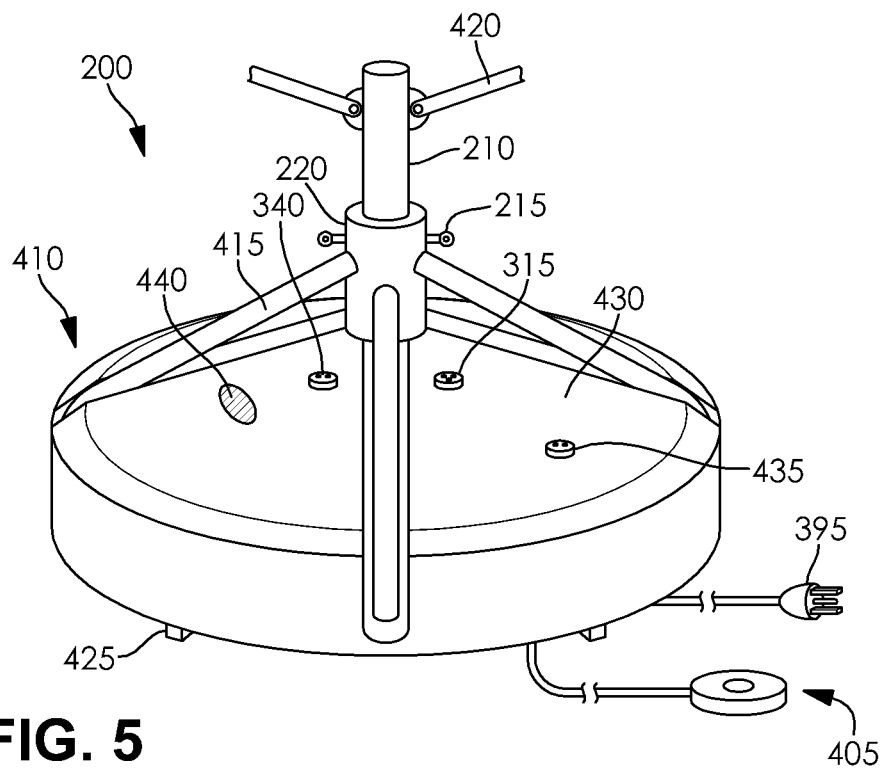
FIG. 5 illustrates a perspective view of at least some exemplary embodiments of the present disclosure.

As illustrated in FIG. 5, system 200 may include a base cover assembly 410 of assembly 205. Base cover assembly 410 may be a rotating tree stand base. Base cover assembly 410 may be a separate member that may be disposed over base assembly 240 and rotatable assembly 235. It is also contemplated that base cover assembly 410 may be an integral part of base assembly 240 and/or may be used with the other exemplary embodiments described herein. Base cover assembly 410 may include a plurality of members 415 that may be structural members such as struts that help support housing 220. Assembly 205 may thereby maintain member 210 that may have a plurality of members 420 (e.g., decorative components such as tree branches when system 200 is an artificial tree system). Member 210 may be a grounded member such as a grounded artificial tree pole. Housing 220, members 415, and members 420 may form a tree stand such as a 4-legged tree stand. Base cover assembly 410 may include a plurality of support members 425 (such as a leg, foot, or other structural member) for supporting system 200. Base cover assembly 410 may include apertures at a top surface 430 at which electrical component 315 (e.g., a 3-wire AC safety socket) and electrical component 340 (e.g., a DC plug) may be mounted and be accessible. FIG. 5 also illustrates electrical component 395 (e.g., an AC 3-wire safety plug with cord) and electrical component 405 (e.g., a DC switch and cord) to allow a user to sequence a display of DC decoration display components (e.g., disposed on members 420) and/or rotary functions of actuator 260 (e.g., a tree motor). Additionally as illustrated in FIG. 5, system 200 may include a Wi-Fi/Bluetooth system having a communication component 435 such as a receiver (e.g., a Wi-Fi/Bluetooth receiver) and an audio component 440 (e.g., a speaker of an audio system). Communication component 435 may provide remote control of rotary functions of assembly 205 and DC lighting signals for LED display variations of system 200. The exemplary disclosed Wi-Fi/Bluetooth system may also connect to the exemplary audio system (e.g., recording and replay audio system) for storage and replaying, via audio component 440) of messages and songs from any suitable device (e.g., computers, smart devices such as smart phones, tablets, systems such as Alexa, and/or Google-type devices).

Figure 6:
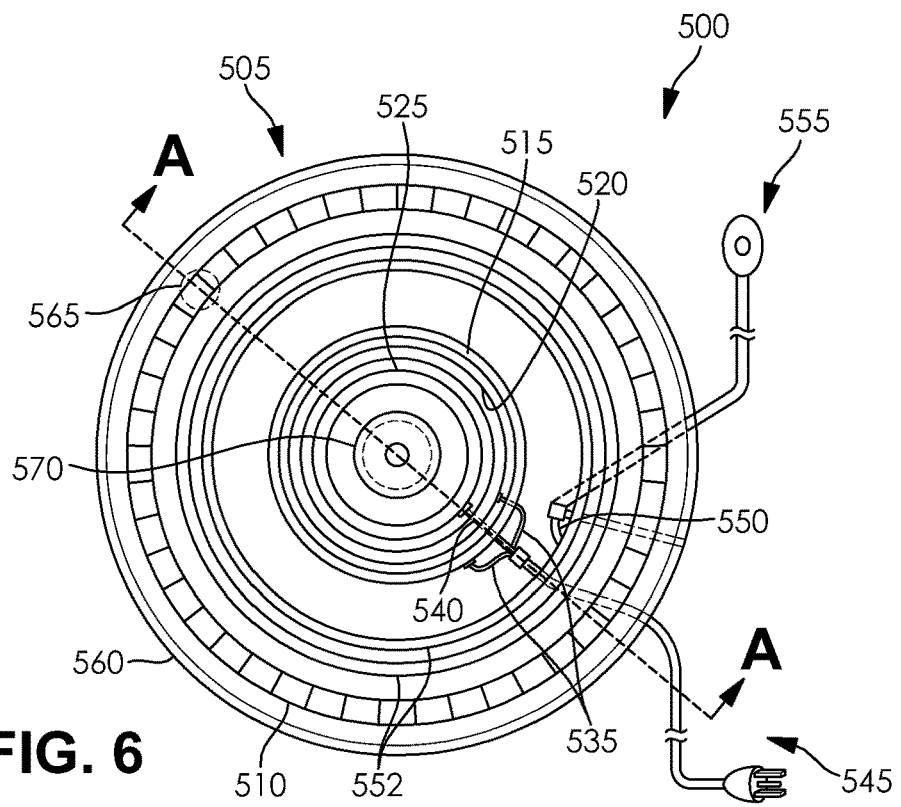
FIG. 6 illustrates a top view of the bottom of a tree stand base of at least some exemplary embodiments of the present disclosure.
Figure 7:
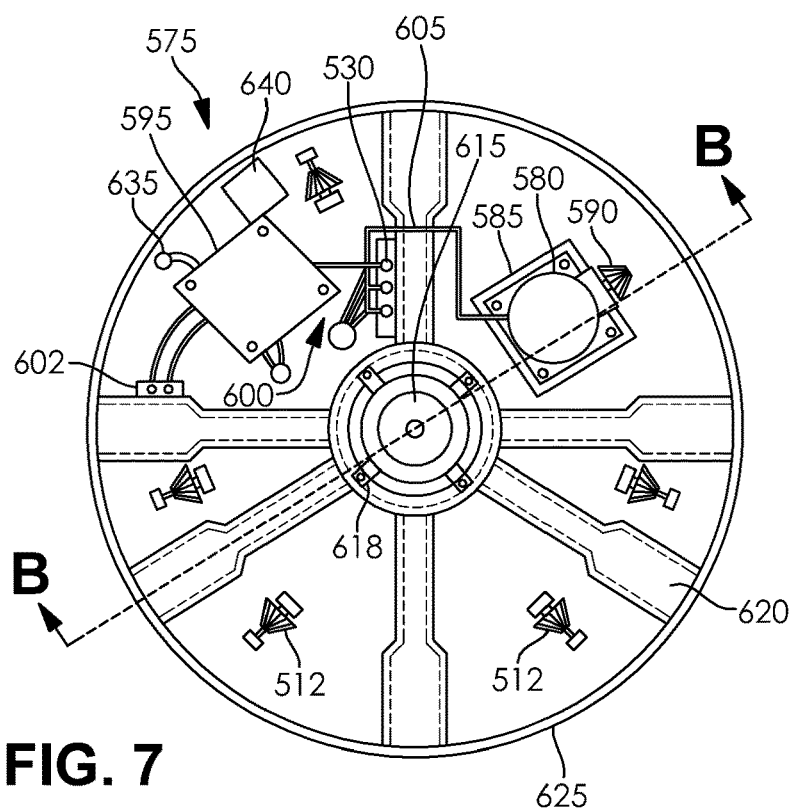
FIG. 7 illustrates a bottom view of the top of a tree stand base of at least some exemplary embodiments of the present disclosure.
Figure 8:
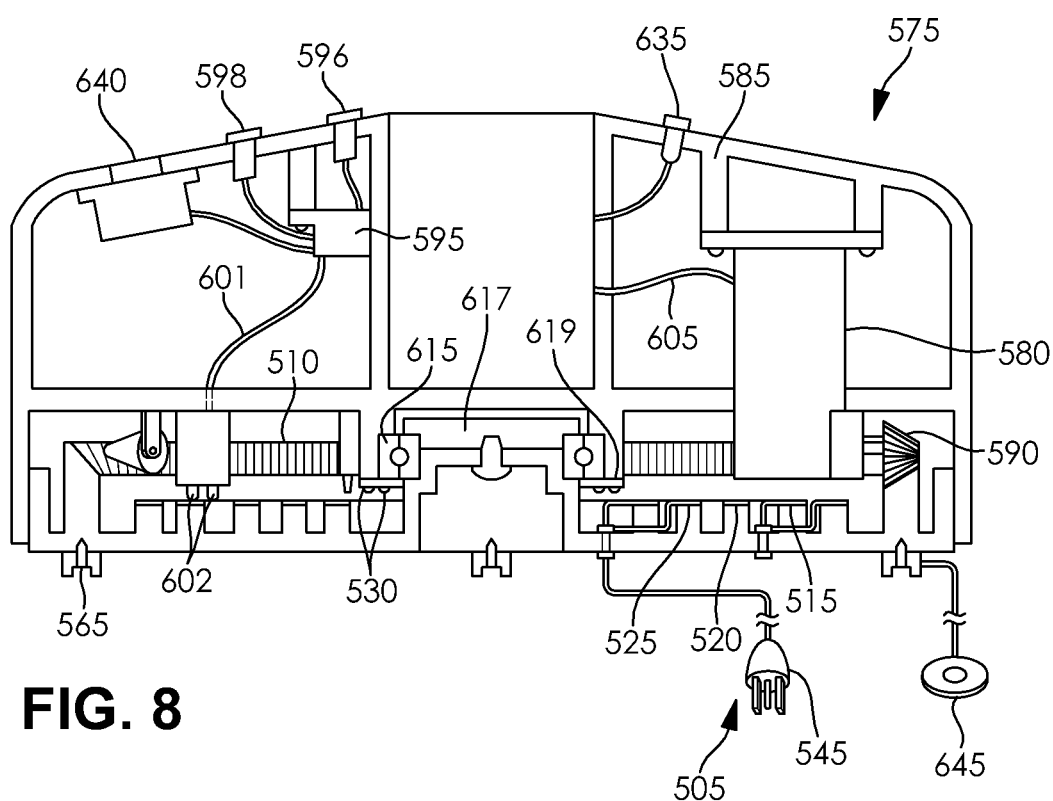
FIG. 8 illustrates a cross-sectional view of at least some exemplary embodiments of the present disclosure.

FIGS. 6-8 illustrate an exemplary system 500. System 500 may include components that may be similar to systems 100 and 200. Components of systems 100, 200, and 500 may be used interchangeably with each other so that exemplary disclosed features of the exemplary disclosed systems may be used together. FIG. 6 illustrates a top view of a base assembly 505 that may be generally similar to portions of assembly 205. As illustrated in FIG. 6, system 500 may include a member 510 (e.g., a circular 45-degree angle bevel gear such as a raised 45-degree gear wheel) that may be configured to engage with a plurality of members 512 illustrated in FIG. 7 (e.g., 45-degree bevel gears some of which may be disposed on a drive motor similar to actuator 260 that may be mounted at a top of base assembly 505). FIG. 6 also illustrates protrusions (e.g., raised portions) such as a portion 515, a portion 520, and a portion 525 that may be raised elongated portions (e.g., circular raised sections). Portions 515, 520, and/or 525 may extend elliptically about a center portion of base assembly 505. Portions 515, 520, and 525 may have conductive surfaces that contact one or more contact members such as contacts 530 (e.g., spring-loaded contacts) illustrated in FIG. 7. Portions 515 and 520 may be raised AC contact strips. Portion 525 may be a raised third wire safety AC contact strip. FIG. 6 also illustrates a plurality of electrical members 535 (e.g., wire connections such as AC leads) that may connect to portions 515 and 520 and an electrical member 540 (e.g., wire connection such as a safety ground lead) that may connect to portion 525. Electrical members 535 and electrical member 540 may then exit a bottom portion of base assembly 505 as part of an electrical connector such as an electrical component 545 (e.g., including an AC cable and a 3-wire safety AC plug) that may be generally similar to electrical component 395. Electrical members 550 (e.g., leads such as switch leads) may connect portions 552 (e.g., contacts that may be raised contact strips, for example DC contacts) externally to an electrical component 555 (e.g., including a selector switch and a switch cable that may sequence functions such as rotation of base assembly 505) that may be generally similar to electrical component 405. Base assembly 505 may also include a vertical edge 560 forming an outside of base assembly 505, one or more members 565 (e.g., support member such as a leg support or foot) for supporting base assembly 505, and a portion 570 that may be a bearing lower support surface (e.g., for a component of system 500 such as a member similar to member 210).

FIG. 7 illustrates a bottom view of a base cover assembly 575 (e.g., base top member of a tree stand) of system 500 that may have components that may be generally similar to base cover assembly 410. Base cover assembly 575 may be a movable assembly (e.g., movable in any direction). Base cover assembly 575 and base assembly 505 may engage with each other as illustrated in FIG. 8. FIG. 7 illustrates an actuator 580 (e.g., a vertically-mounted motor such as a 90-degree-mounted gear motor mounted on a support 585 and having a gear 590 that may be a 90-degree gear) that may be similar to actuator 260. Gear 590 may engage with member 510 (e.g., a 45-degree beveled gear that may engage and mate with member 510 that may be a circular gear track disposed at a bottom of base assembly 505). FIG. 7 illustrates contacts 530 (e.g., AC spring contacts such as spring-loaded contactors) that may mate to portions 515, 520, and 525 (e.g., circular conductors disposed at the bottom of base assembly 505 as illustrated in FIG. 6). FIG. 7 also illustrates members 512 (e.g., support bevel gears that may be 90-degree gears each disposed on a gear bearing support) that may provide stabilization support for base cover assembly 575 during rotation. Base cover assembly 575 may thereby rotate on base assembly 505 (e.g., as illustrated in FIG. 8, the surface illustrated in FIG. 7 may be supported on the surface illustrated in FIG. 6). Contacts 530 may be connected to an electrical component 595 (e.g., an electronic control package including a control section) via a plurality of electrical members 600 (e.g., wires) that may be similar to electrical members 325 and 330. Contacts 530 may also be connected to actuator 580 via a plurality of electrical members 605 (e.g., leads such as motor leads) that may be similar to electrical members 325 and 330. The plurality of electrical members 600 may also connect contacts 530 to electrical components similar to as described above (e.g., an electrical connector such as an electrical component 596 as illustrated in FIG. 8 that may be a female 3-wire safety socket that may be similar to electrical component 315, and an electrical component 598 as illustrated in FIG. 8 that may be a DC socket that may be similar to electrical component 340 for low voltage tree display items such as example for LED light strings). As illustrated in FIGS. 7 and 8, electrical component 595 may be connected via electrical members 601 (e.g., DC wires) to a contact 602 that may be a DC pick-up spring contact.

Returning to FIG. 7, base cover assembly 575 may also include a bearing 615 (e.g., a center bearing such as an internal bearing plate). Bearing 615 may be supported by a plurality of support members 618 (e.g., bearing retainers that may include a base bearing clamp 617 and an upper bearing clamp 619 as illustrated in FIG. 8). Returning to FIG. 7, base cover assembly 575 may also include a plurality of cavities 620 that may be tree stand cavities (e.g., valleys). The plurality of cavities 620 may be configured to receive 3-legged stands, 4-legged stands, and/or any other suitable configuration of stands. FIG. 7 illustrates cavities 620 having housing bottoms forming the cavities that extend toward the viewer (e.g., as viewed by the viewer). Base cover assembly 575 may also include a wall member 625 (e.g., vertical lip) forming an exterior wall of base cover assembly 575. Additionally, system 500 may include a Wi-Fi/Bluetooth system having a communication component 635 such as a receiver (e.g., a Wi-Fi/Bluetooth receiver) that may be similar to communication component 435 and an audio component 640 (e.g., a speaker of an audio system) that may be similar to audio component 440. Communication component 635 and audio component 640 may be connected to electrical component 595 and/or directly to each other.

FIG. 8 illustrates a cross-sectional view of sections A-A labeled in FIGS. 6 and B-B labeled in FIG. 7. As illustrated in FIG. 8, a bottom of base cover assembly 575 (e.g., as illustrated in FIG. 7) may be disposed on (e.g., mated on) a top of base assembly 505 (e.g., as illustrated in FIG. 6).

Figure 9:
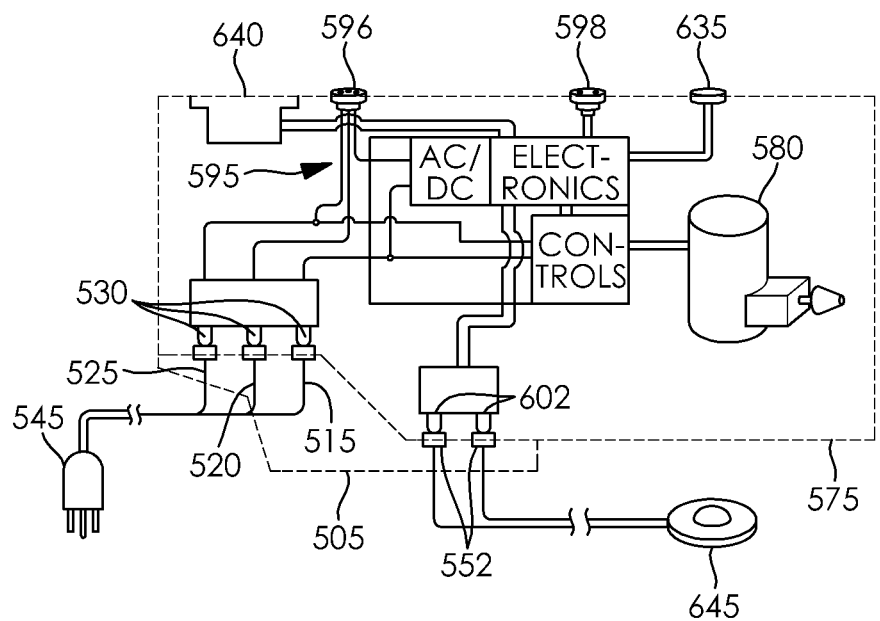
FIG. 9 illustrates a schematic view of at least some exemplary embodiments of the present disclosure.

FIG. 9 schematically illustrates a circuit diagram of an exemplary disclosed circuit of system 500 of FIGS. 6-8, including base assembly 505 and base cover assembly 575 (e.g., forming a rotary artificial stand base). As illustrated in FIG. 9, the exemplary disclosed circuit of system 500 may include electrical component 545 that may be connected to a bottom of base assembly 505 and may be in electrical contact with one or more contacts 530 (e.g., attaching to circular conductor surfaces having spring-loaded contactors) carrying current to electrical component 595. Electrical component 595 may include an electronics box where the AC electricity connects to an AC/DC Hi/Lo adapter (e.g., that may be similar to electrical component 400) that supplies DC electricity for electronics and motor controls as illustrated in FIG. 9. Electrical component 595 may control a display of low voltage items that may be plugged into electrical component 598 (e.g., a DC socket). FIG. 9 also illustrates the connection of AC power to electrical component 596 (e.g., an AC 3-wire safety socket that may be mounted in base cover assembly 575 as described for example above). FIG. 9 also illustrates the further exemplary connection of AC to actuator 580 for rotatable operation of system 500. FIG. 9 also illustrates an electrical component 645 (e.g., a DC switch) that may be similar to electrical component 405 and may be electrically connected to electrical component 595. Electrical component 645 may provide the signal (e.g., input signal) to the electronics of electrical component 595 to control a rotation of system 500 and a display of the exemplary disclosed low voltage items. FIG. 9 also illustrates an electrical connection of communication component 635 and audio component 640 to electrical component 595 for providing connection of the exemplary disclosed audio system (e.g., speaker and audio system electronics) to the stand electronics (e.g., included in electrical component 595) to allow audio interface to communication component 635 (e.g., including a Wi-Fi/Bluetooth receiver).

In at least some exemplary embodiments, the exemplary disclosed system and apparatus may include a base assembly (e.g., base assembly 240, base assembly 505, or a portion of assembly 105), a movable assembly (e.g., rotatable assembly 235, base cover assembly 575, or a portion of assembly 105) that is movably supported by the base assembly and that is movable relative to the base assembly, a structural assembly (e.g., member 110, member 210, or a member supported by system 500) that is supported by the movable assembly, a plurality of electrical assemblies supported by the structural assembly, and a first electrical connector (e.g., electrical component 315, electrical component 596, or portion of system 100) that is electrically connectable to some of the plurality of electrical assemblies, the first electrical connector being attached to the movable assembly and including a first plurality of electrical members. The exemplary disclosed system or apparatus may also include a second electrical connector (e.g., electrical component 355 or electrical component 545) that is electrically connectable to a power source, the second electrical connector being attached to the base assembly and including a second plurality of electrical members, and one or more contact members (e.g., conductive member 305, contact 530, or contacts of system 100) that are movably disposed relative to the base assembly, the one or more contact members moving relative to the base assembly when the movable assembly moves relative to the base assembly. The first plurality of electrical members and the second plurality of electrical members may remain electrically connected via the one or more contact members when the one or more contact members moves relative to the base assembly when the movable assembly moves relative to the base assembly. The movable assembly may be rotatably supported by the base assembly and may be rotatable relative to the base assembly. The one or more contact members may be selected from the group consisting of ball bearings and spring-loaded contacts. Each of the first plurality of electrical members and the second plurality of electrical members may have a 3-wire AC configuration including a 2-wire system and a third additional safety wire. The second plurality of electrical members may further include wires that are electrically connected to an actuator that selectively moves the movable assembly relative to the base assembly. The second plurality of electrical members may be electrically connected to an AC/DC, HI/LO adapter, the AC/DC HI/LO adapter selectively controlling a voltage of the second plurality of electrical members based on being controlled by a switch electrically connected to the AC/DC HI/LO adapter. The structural assembly may be an artificial holiday tree and at least some of the plurality of electrical assemblies may be LED lights. The exemplary disclosed system and apparatus may further include a third electrical connector that is electrically connectable to some of the plurality of electrical assemblies, the third electrical connector being a DC socket that is attached to the movable assembly and that includes two DC wires. The exemplary disclosed system and apparatus may further include two DC contact members that are movably disposed relative to the base assembly, the two DC contact members moving relative to the base assembly when the movable assembly moves relative to the base assembly, wherein the two DC wires remain electrically connected via the two DC contact members to the base assembly when the two DC contact members move relative to the base assembly when the movable assembly moves relative to the base assembly. The exemplary disclosed system and apparatus may further include a switch that is electrically connected to the two DC wires via a second plurality of DC wires that are electrically connected to the two DC contact members, wherein the switch is electrically connected to an AC/DC, HI/LO adapter, and wherein the second plurality of electrical members are electrically connected to the AC/DC, HI/LO adapter, the AC/DC HI/LO adapter selectively controlling a voltage of the second plurality of electrical members based on being controlled by the switch.

In at least some exemplary embodiments, the exemplary disclosed system and apparatus may include a base assembly (e.g., base assembly 240) including at least one first elongated recess having a first conductive surface, a rotatable assembly that is rotatably supported by the base assembly and that is rotatable relative to the base assembly, the rotatable assembly (e.g., rotatable assembly 235) including at least one second elongated recess having a second conductive surface that faces the first conductive surface, a structural assembly (e.g., member 210) that is supported by the rotatable assembly, and a plurality of electrical assemblies supported by the structural assembly. The exemplary disclosed system and apparatus may also include a first electrical connector (e.g., electrical component 315) that is electrically connectable to some of the plurality of electrical assemblies, the first electrical connector being attached to the rotatable assembly and including a first plurality of electrical members, a second electrical connector (e.g., electrical component 355) that is electrically connectable to a power source, the second electrical connector being attached to the base assembly and including a second plurality of electrical members, and one or more contact members (e.g., conductive member 305) that are movably disposed in a cavity formed between the first and second conductive surfaces, the one or more contact members movable along the cavity when the movable assembly moves relative to the base assembly. The first plurality of electrical members and the second plurality of electrical members may remain electrically connected via the first and second conductive surfaces and the one or more contact members when the movable assembly moves relative to the base assembly. The one or more contact members may be ball bearings. Each of the first plurality of electrical members and the second plurality of electrical members may have a 3-wire AC configuration including a 2-wire system and a third additional safety wire. The at least one first elongated recess may be a plurality of first elongated recesses and the at least one second elongated recess may be a plurality of second elongated recesses, the plurality of first and second elongated recesses forming a plurality of cavities disposed between the base assembly and the rotatable assembly. A first cavity and a second cavity of the plurality of cavities may be formed between a side portion of the base assembly and a side portion of the rotatable assembly, one or more side contact members disposed in the first and second cavities being in electrical contact with the 2-wire system. A third cavity of the plurality of cavities may be formed between a top portion of the base assembly and a bottom portion of the rotatable assembly, one or more bottom contact members disposed in the third cavity being in electrical contact with the third additional safety wire.

In at least some exemplary embodiments, the exemplary disclosed system and apparatus may include a base assembly (e.g., base assembly 505) including a first elongated protrusion, a second elongated protrusion, and a third elongated protrusion (e.g., portions 515, 520, and 525), a rotatable assembly (e.g., base cover assembly 575) that may be rotatably supported by the base assembly and that may be rotatable relative to the base assembly, the rotatable assembly including a first contact member, a second contact member, and a third contact member (e.g., contacts 530), a structural assembly that may be supported by the rotatable assembly, and a plurality of electrical assemblies supported by the structural assembly. The exemplary disclosed system and apparatus may also include a first electrical connector (e.g., electrical component 596) that may be electrically connectable to some of the plurality of electrical assemblies, the first electrical connector being attached to the rotatable assembly and including a first plurality of electrical members, and a second electrical connector (e.g., electrical component 545) that may be electrically connectable to a power source, the second electrical connector being attached to the base assembly and including a second plurality of electrical members. The first contact member may align with the first elongated protrusion when the rotatable assembly rotates relative to the base assembly, the second contact member may align with the second elongated protrusion when the rotatable assembly rotates relative to the base assembly, and the third contact member may align with the third elongated protrusion when the rotatable assembly rotates relative to the base assembly. The first, second, and third contact members may remain electrically connected, respectively, with the first, second, and third elongated protrusions when the movable assembly moves relative to the base assembly. Each of the first plurality of electrical members and the second plurality of electrical members may have a 3-wire AC configuration including a 2-wire system and a third additional safety wire. Each of the first, second, and third contact members may be spring-loaded contacts. The first, second, and third elongated protrusions may form concentric circles extending about a center portion of the base assembly.

The exemplary disclosed system, apparatus, and method may be used in any suitable application for providing an electrical safety circuit. The exemplary disclosed system, apparatus, and method may also be used in any suitable application for grounding an electrical device. For example, the exemplary disclosed system, apparatus, and method may be used in any application involving grounding a decorative lighting assembly and/or any other suitable device that may be grounded. In at least some exemplary embodiments, the exemplary disclosed system, apparatus, and method may be used in any suitable application for grounding a rotating artificial tree stand.

The exemplary disclosed system, apparatus, and method may provide an efficient and effective technique for providing an electrical safety circuit. For example, the exemplary disclosed system, apparatus, and method may provide an efficient and effective technique for grounding an artificial decorative display. For example, some exemplary embodiments may provide effective grounding of an artificial tree. In at least some exemplary embodiments, the exemplary disclosed system, apparatus, and method may provide effective grounding for a rotating tree stand.

In the Summary above and in this Detailed Description, and the claims below, and in the accompanying drawings, reference is made to particular features of various embodiments of the invention. It is to be understood that the disclosure of embodiments of the invention in this specification includes all possible combinations of such particular features. For example, where a particular feature is disclosed in the context of a particular aspect or embodiment of the invention, or a particular claim, that feature can also be used—to the extent possible—in combination with and/or in the context of other particular aspects and embodiments of the invention, and in the invention generally.

While multiple embodiments are disclosed, still other embodiments of the present invention will become apparent to those skilled in the art from this detailed description. The invention is capable of myriad modifications in various obvious aspects, all without departing from the spirit and scope of the present invention. Accordingly, the drawings and descriptions are to be regarded as illustrative in nature and not restrictive.

It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments.

In the present disclosure, various features may be described as being optional, for example, through the use of the verb "may;", or, through the use of any of the phrases:

"in some embodiments," "in some implementations," "in some designs," "in various embodiments," "in various implementations,", "in various designs," "in an illustrative example," or "for example;" or, through the use of parentheses. For the sake of brevity and legibility, the present disclosure does not explicitly recite each and every permutation that may be obtained by choosing from the set of optional features. However, the present disclosure is to be interpreted as explicitly disclosing all such permutations. For example, a system described as having three optional features may be embodied in seven different ways, namely with just one of the three possible features, with any two of the three possible features or with all three of the three possible features.

In various embodiments. elements described herein as coupled or connected may have an effectual relationship realizable by a direct connection or indirectly with one or more other intervening elements.

In the present disclosure, the term "any" may be understood as designating any number of the respective elements, i.e. as designating one, at least one, at least two, each or all of the respective elements. Similarly, the term "any" may be understood as designating any collection(s) of the respective elements, i.e. as designating one or more collections of the respective elements, a collection comprising one, at least one, at least two, each or all of the respective elements. The respective collections need not comprise the same number of elements.

While various embodiments of the present invention have been disclosed and described in detail herein, it will be apparent to those skilled in the art that various changes may be made to the configuration, operation and form of the invention without departing from the spirit and scope thereof. In particular, it is noted that the respective features of embodiments of the invention, even those disclosed solely in combination with other features of embodiments of the invention, may be combined in any configuration excepting those readily apparent to the person skilled in the art as nonsensical. Likewise, use of the singular and plural is solely for the sake of illustration and is not to be interpreted as limiting.

In the present disclosure, all embodiments where "comprising" is used may have as alternatives "consisting essentially of," or "consisting of." In the present disclosure, any method or apparatus embodiment may be devoid of one or more process steps or components. In the present disclosure, embodiments employing negative limitations are expressly disclosed and considered a part of this disclosure.

Certain terminology and derivations thereof may be used in the present disclosure for convenience in reference only and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

The term "comprises" and grammatical equivalents thereof are used herein to mean that other components, ingredients, steps, among others, are optionally present. For example, an embodiment "comprising" (or "which comprises") components A, B and C can consist of (i.e., contain only) components A, B and C, or can contain not only components A, B, and C but also contain one or more other components.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number (which may be a range having an upper limit or no upper limit, depending on the variable being defined). For example, "at least 1" means 1 or more than 1. The term "at most" followed by a number (which may be a range having 1 or 0 as its lower limit, or a range having no lower limit, depending upon the variable being defined). For example, "at most 4" means 4 or less than 4, and "at most 40%" means 40% or less than 40%. When, in this specification, a range is given as "(a first number) to (a second number)" or "(a first number)—(a second number)," this means a range whose limit is the second number. For example, 25 to 100 mm means a range whose lower limit is 25 mm and upper limit is 100 mm.

Many suitable methods and corresponding materials to make each of the individual parts of embodiment apparatus are known in the art. According to an embodiment of the present invention, one or more of the parts may be formed by machining, 3D printing (also known as "additive" manufacturing), CNC machined parts (also known as "subtractive" manufacturing), and injection molding, as will be apparent to a person of ordinary skill in the art. Metals, wood, thermoplastic and thermosetting polymers, resins and elastomers as may be described herein-above may be used. Many suitable materials are known and available and can be selected and mixed depending on desired strength and flexibility, preferred manufacturing method and particular use, as will be apparent to a person of ordinary skill in the art.

Any element in a claim herein that does not explicitly state "means for" performing a specified function, or "step for" performing a specific function, is not to be interpreted as a "means" or "step" clause as specified in 35 U.S.C. § 112 (f). Specifically, any use of "step of" in the claims herein is not intended to invoke the provisions of 35 U.S.C. § 112 (f).

According to an embodiment of the present invention, the system and method may be accomplished through the use of one or more computing devices. One of ordinary skill in the art would appreciate that an exemplary system appropriate for use with embodiments in accordance with the present application may generally include one or more of a Central processing Unit (CPU), Random Access Memory (RAM), a storage medium (e.g., hard disk drive, solid state drive, flash memory, cloud storage), an operating system (OS), one or more application software, a display element, one or more communications means, or one or more input/output devices/means. Examples of computing devices usable with embodiments of the present invention include, but are not limited to, proprietary computing devices, personal computers, mobile computing devices, tablet PCs, mini-PCs, servers or any combination thereof. The term computing device may also describe two or more computing devices communicatively linked in a manner as to distribute and share one or more resources, such as clustered computing devices and server banks/farms. One of ordinary skill in the art would understand that any number of computing devices could be used, and embodiments of the present invention are contemplated for use with any computing device.

In various embodiments, communications means, data store(s), processor(s), or memory may interact with other components on the computing device, in order to effect the provisioning and display of various functionalities associated with the system and method detailed herein. One of ordinary skill in the art would appreciate that there are numerous configurations that could be utilized with embodiments of the present invention, and embodiments of the present invention are contemplated for use with any appropriate configuration.

According to an embodiment of the present invention, the communications means of the system may be, for instance, any means for communicating data over one or more networks or to one or more peripheral devices attached to the system. Appropriate communications means may include, but are not limited to, circuitry and control systems for providing wireless connections, wired connections, cellular connections, data port connections, Bluetooth connections, or any combination thereof. One of ordinary skill in the art would appreciate that there are numerous communications means that may be utilized with embodiments of the present invention, and embodiments of the present invention are contemplated for use with any communications means.

Throughout this disclosure and elsewhere, block diagrams and flowchart illustrations depict methods, apparatuses (i.e., systems), and computer program products. Each element of the block diagrams and flowchart illustrations, as well as each respective combination of elements in the block diagrams and flowchart illustrations, illustrates a function of the methods, apparatuses, and computer program products. Any and all such functions ("disclosed functions") can be implemented by computer program instructions; by special-purpose, hardware-based computer systems; by combinations of special purpose hardware and computer instructions; by combinations of general purpose hardware and computer instructions; and so on—any and all of which may be generally referred to herein as a "circuit," "module," or "system."

While the foregoing drawings and description may set forth functional aspects of the disclosed systems, no particular arrangement of software for implementing these functional aspects should be inferred from these descriptions unless explicitly stated or otherwise clear from the context.

Each element in flowchart illustrations may depict a step, or group of steps, of a computer-implemented method. Further, each step may contain one or more sub-steps. For the purpose of illustration, these steps (as well as any and all other steps identified and described above) are presented in order. It will be understood that an embodiment can contain an alternate order of the steps adapted to a particular application of a technique disclosed herein. All such variations and modifications are intended to fall within the scope of this disclosure. The depiction and description of steps in any particular order is not intended to exclude embodiments having the steps in a different order, unless required by a particular application, explicitly stated, or otherwise clear from the context.

Traditionally, a computer program consists of a sequence of computational instructions or program instructions. It will be appreciated that a programmable apparatus (i.e., computing device) can receive such a computer program and, by processing the computational instructions thereof, produce a further technical effect.

A programmable apparatus may include one or more microprocessors, microcontrollers, embedded microcontrollers, programmable digital signal processors, programmable devices, programmable gate arrays, programmable array logic, memory devices, application specific integrated circuits, or the like, which can be suitably employed or configured to process computer program instructions, execute computer logic, store computer data, and so on. Throughout this disclosure and elsewhere a computer can include any and all suitable combinations of at least one general purpose computer, special-purpose computer, programmable data processing apparatus, processor, processor architecture, and so on.

It will be understood that a computer can include a computer-readable storage medium and that this medium may be internal or external, removable and replaceable, or fixed. It will also be understood that a computer can include a Basic Input/Output System (BIOS), firmware, an operating system, a database, or the like that can include, interface with, or support the software and hardware described herein.

Embodiments of the system as described herein are not limited to applications involving conventional computer programs or programmable apparatuses that run them. It is contemplated, for example, that embodiments of the invention as claimed herein could include an optical computer, quantum computer, analog computer, or the like.

Regardless of the type of computer program or computer involved, a computer program can be loaded onto a computer to produce a particular machine that can perform any and all of the disclosed functions. This particular machine provides a means for carrying out any and all of the disclosed functions.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

In some embodiments, computer program instructions may be stored in a computer-readable memory capable of directing a computer or other programmable data processing apparatus to function in a particular manner. The instructions stored in the computer-readable memory constitute an article of manufacture including computer-readable instructions configured to implement any and all of the disclosed functions.

A computer readable signal medium may include a propagated data signal with computer readable program code embodied therein, for example, in baseband or as part of a carrier wave. Such a propagated signal may take any of a variety of forms, including, but not limited to, electromagnetic, optical, or suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

The elements depicted in flowchart illustrations and block diagrams throughout the figures imply logical boundaries between the elements. However, according to software or hardware engineering practices, the disclosed elements and the functions thereof may be implemented as parts of a monolithic software structure, as standalone software modules, or as modules that employ external routines, code, services, and so forth, or any combination of these. All such implementations are within the scope of the present disclosure.

Unless explicitly stated or otherwise clear from the context, the verbs "execute" and "process" are used interchangeably to indicate execute, process, interpret, compile, assemble, link, load, any and all combinations of the foregoing, or the like. Therefore, embodiments that execute or process computer program instructions, computer-executable code, or the like can suitably act upon the instructions or code in any and all of the ways just described.

The functions and operations presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will be apparent to those of skill in the art, along with equivalent variations. In addition, embodiments of the invention are not described with reference to any particular programming language. It is appreciated that a variety of programming languages may be used to implement the present teachings as described herein, and any references to specific languages are provided for disclosure of enablement and best mode of embodiments of the invention. Embodiments of the invention are well suited to a wide variety of computer network systems over numerous topologies. Within this field, the configuration and management of large networks include storage devices and computers that are communicatively coupled to dissimilar computers and storage devices over a network, such as the Internet.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. An apparatus, comprising:
a base assembly;
a movable assembly that is movably supported by the base assembly and that is movable relative to the base assembly;
a structural assembly that is supported by the movable assembly;
a plurality of electrical assemblies supported by the structural assembly;
a first electrical connector that is electrically connectable to some of the plurality of electrical assemblies, the first electrical connector being attached to the movable assembly and including a first plurality of electrical members;
a second electrical connector that is electrically connectable to a power source, the second electrical connector being attached to the base assembly and including a second plurality of electrical members;
one or more contact members that are movably disposed relative to the base assembly, the one or more contact members moving relative to the base assembly when the movable assembly moves relative to the base assembly; and
a third electrical connector that is electrically connectable to some of the plurality of electrical assemblies, the third electrical connector being attached to the movable assembly;
wherein the first plurality of electrical members and the second plurality of electrical members remain electrically connected via the one or more contact members when the one or more contact members moves relative to the base assembly when the movable assembly moves relative to the base assembly.

2. The apparatus of claim 1, wherein the movable assembly is rotatably supported by the base assembly and is rotatable relative to the base assembly.

3. The apparatus of claim 1, wherein the one or more contact members are selected from the group consisting of ball bearings and spring-loaded contacts.

4. The apparatus of claim 1, wherein each of the first plurality of electrical members and the second plurality of electrical members has a 3-wire AC configuration including a 2-wire system and a third additional safety wire.

5. The apparatus of claim 1, wherein the second plurality of electrical members further includes wires that are electrically connected to an actuator that selectively moves the movable assembly relative to the base assembly.

6. The apparatus of claim 1, wherein the second plurality of electrical members are electrically connected to an AC/DC HI/LO adapter, the AC/DC HI/LO adapter selectively controlling a voltage of the second plurality of electrical members based on being controlled by a switch electrically connected to the AC/DC HI/LO adapter.

7. The apparatus of claim 1, wherein:
the structural assembly is an artificial holiday tree and at least some of the plurality of electrical assemblies are LED lights; and
the apparatus further includes a Wi-Fi/Bluetooth receiver and an audio speaker.

8. The apparatus of claim 1, wherein the third electrical connector is a DC socket that includes two DC wires.

9. The apparatus of claim 8, further comprising:
two DC contact members that are movably disposed relative to the base assembly, the two DC contact members moving relative to the base assembly when the movable assembly moves relative to the base assembly;
wherein the two DC wires remain electrically connected via the two DC contact members to the base assembly when the two DC contact members move relative to the base assembly when the movable assembly moves relative to the base assembly.

10. The apparatus of claim 9, further comprising:
a switch that is electrically connected to the two DC wires via a second plurality of DC wires that are electrically connected to the two DC contact members;
wherein the switch is electrically connected to an AC/DC, HI/LO adapter; and wherein the second plurality of electrical members are electrically connected to the AC/DC, HI/LO adapter, the AC/DC HI/LO adapter selectively controlling a voltage of the second plurality of electrical members based on being controlled by the switch.

11. An apparatus, comprising:
a base assembly including at least one first recess having a first conductive surface;
a rotatable assembly that is rotatably supported by the base assembly and that is rotatable relative to the base assembly, the rotatable assembly including at least one second recess having a second conductive surface that faces the first conductive surface;
a structural assembly that is supported by the rotatable assembly;
a plurality of electrical assemblies supported by the structural assembly;
a first electrical connector that is electrically connectable to some of the plurality of electrical assemblies, the first electrical connector being attached to the rotatable assembly and including a first plurality of electrical members;
a second electrical connector that is electrically connectable to a power source, the second electrical connector being attached to the base assembly and including a second plurality of electrical members; and
one or more contact members that are movably disposed in a cavity formed between the first and second conductive surfaces, the one or more contact members movable along the cavity when the rotatable assembly moves relative to the base assembly;
wherein the first plurality of electrical members and the second plurality of electrical members remain electrically connected via the first and second conductive surfaces and the one or more contact members when the rotatable assembly moves relative to the base assembly.

12. The apparatus of claim 11, wherein the one or more contact members are ball bearings.

13. The apparatus of claim 11, wherein each of the first plurality of electrical members and the second plurality of electrical members has a 3-wire AC configuration including a 2-wire system and a third additional safety wire.

14. The apparatus of claim 13, wherein the at least one first recess is a plurality of first recesses and the at least one second recess is a plurality of second recesses, the plurality of first and second recesses forming a plurality of cavities disposed between the base assembly and the rotatable assembly.

15. The apparatus of claim 14, wherein a first cavity and a second cavity of the plurality of cavities is formed between a side portion of the base assembly and a side portion of the rotatable assembly, one or more side contact members disposed in the first and second cavities being in electrical contact with the 2-wire system.

16. The apparatus of claim 15, wherein a third cavity of the plurality of cavities is formed between a top portion of the base assembly and a bottom portion of the rotatable assembly, one or more bottom contact members disposed in the third cavity being in electrical contact with the third additional safety wire.

17. An apparatus, comprising:
a base assembly including a first elongated protrusion, a second elongated protrusion, and a third elongated protrusion;
a rotatable assembly that is rotatably supported by the base assembly and that is rotatable relative to the base assembly, the rotatable assembly including a first contact member, a second contact member, and a third contact member;
a structural assembly that is supported by the rotatable assembly;
a plurality of electrical assemblies supported by the structural assembly;
a first electrical connector that is electrically connectable to some of the plurality of electrical assemblies, the first electrical connector being attached to the rotatable assembly and including a first plurality of electrical members; and
a second electrical connector that is electrically connectable to a power source, the second electrical connector being attached to the base assembly and including a second plurality of electrical members;
wherein the first contact member aligns with the first elongated protrusion when the rotatable assembly rotates relative to the base assembly, the second contact member aligns with the second elongated protrusion when the rotatable assembly rotates relative to the base assembly, and the third contact member aligns with the third elongated protrusion when the rotatable assembly rotates relative to the base assembly; and
wherein the first, second, and third contact members remain electrically connected, respectively, with the first, second, and third elongated protrusions when the rotatable assembly moves relative to the base assembly.

18. The apparatus of claim 17, wherein each of the first plurality of electrical members and the second plurality of electrical members has a 3-wire AC configuration including a 2-wire system and a third additional safety wire.

19. The apparatus of claim 17, wherein each of the first, second, and third contact members are spring-loaded contacts.

20. The apparatus of claim 17, wherein the first, second, and third elongated protrusions form concentric circles disposed about a center portion of the base assembly.

* * * * *